United States Patent
Tsai

(10) Patent No.: US 8,587,574 B2
(45) Date of Patent: Nov. 19, 2013

(54) PIXEL STRUCTURE OF ELECTROLUMINESCENT DISPLAY PANEL HAVING POWER LINES WITH LOW VOLTAGE DROP

(75) Inventor: Tsung-Ting Tsai, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 438 days.

(21) Appl. No.: 12/764,980

(22) Filed: Apr. 22, 2010

(65) Prior Publication Data

US 2011/0157122 A1 Jun. 30, 2011

(30) Foreign Application Priority Data

Dec. 28, 2009 (TW) ............................... 98145318 A

(51) Int. Cl.
*G06F 3/038* (2013.01)
*G09G 5/00* (2006.01)

(52) U.S. Cl.
USPC .................................. 345/211; 315/169.3

(58) Field of Classification Search
USPC ........................................ 345/211; 315/169.3
See application file for complete search history.

(56) References Cited

U.S. PATENT DOCUMENTS

| 7,545,347 | B2 | 6/2009 | Kanda | |
|---|---|---|---|---|
| 2004/0108978 | A1 | 6/2004 | Matsueda | |
| 2006/0017393 | A1* | 1/2006 | Kang et al. | 315/169.3 |
| 2006/0038752 | A1* | 2/2006 | Winters | 345/76 |
| 2009/0091521 | A1 | 4/2009 | Kanda | |
| 2011/0050550 | A1* | 3/2011 | Tsai et al. | 345/76 |
| 2012/0154456 | A1* | 6/2012 | Kimura et al. | 345/690 |

FOREIGN PATENT DOCUMENTS

CN 1497513 A 5/2004

* cited by examiner

*Primary Examiner* — Kwang-Su Yang
(74) *Attorney, Agent, or Firm* — Winston Hsu; Scott Margo

(57) ABSTRACT

A pixel structure of an electroluminescent display panel includes a plurality of sub-pixel columns, first power lines, and second power lines. Each of the first power lines and each of the second power lines are disposed between two adjacent sub-pixel columns. Each first power line is electrically connected to a portion of sub-pixels of a sub-pixel column disposed on one side of the first power line, and a portion of sub-pixels of the other sub-pixel column disposed on the other side of the first power line. Each second power line is electrically connected to a portion of sub-pixels of a sub-pixel column disposed on one side of the second power line, and a portion of sub-pixels of the other sub-pixel column disposed on the other side of the second power line.

9 Claims, 4 Drawing Sheets

PIXEL STRUCTURE OF ELECTROLUMINESCENT DISPLAY PANEL HAVING POWER LINES WITH LOW VOLTAGE DROP

BACKGROUND OF THE INVENTION

1. Field of the Invention

The present invention relates to a pixel structure of an electroluminescent display panel, and more particularly, to a pixel structure of an electroluminescent display panel including a plurality of power lines of different voltage signals, each of the power lines being electrically connected to a portion of the sub-pixels on two opposite sides of the power lines alternately.

2. Description of the Prior Art

Recently, electroluminescent display panel, e.g. organic light emitting diode (OLED) display panel, has been widely applied in a variety of flat display products for its advantages such as self-luminance, wide view angle, rapid response time and high luminescent efficiency.

The main stream product in the present consumer market is high resolution and large scale flat display panel devices, and thus, in order to meet the requirement of large scale and high resolution, the scale and resolution of the electroluminescent display panel must be improved. However, when raising the scale and resolution of the electroluminescent display panel, voltage signal drop caused by the increased scale of the panel would occur. To be exact, when the scale of the electroluminescent display panel increases, the length of the power lines required to deliver voltage signals to each of the pixels from the driving chip also has to be increased. Increasing the length of the power line at the same time raises the electrical resistances, resulting in a voltage drop. In other words, the voltage signals received by the pixels located away from the driving chip are lower than the actual voltage signals received by the pixels located near the driving chip, causing the images to be uneven.

Since the voltage drop of the voltage signals causes the images to be uneven and severely affects the quality of display, such issue has become the limitation for the electroluminescent display panel from developing towards larger scale in size.

SUMMARY OF THE INVENTION

It is one of the objectives of the present invention to provide a pixel structure of an electroluminescent display panel so as to solve the issue of uneven display images caused by voltage signal drops of the conventional electroluminescent display panels.

According to a preferred embodiment of the present invention, a pixel structure of an electroluminescent display panel is provided. The pixel structure includes a plurality of sub-pixel columns, a plurality of first power lines and a plurality of second power lines. Each of the sub-pixel columns includes a plurality of sub-pixels, each of the sub-pixels includes a first sub-pixel and a second sub-pixel, and the first sub-pixel and the second sub-pixel of each of the sub-pixels are electrically insulated from each other. Each of the first power lines and each of the second power lines are disposed between two adjacent sub-pixel columns, each of the first power lines is electrically connected to the first sub-pixel of each of the sub-pixels of the sub pixel columns disposed on one side of the first power line, each of the first power lines is electrically connected to the first sub-pixel of each of the sub-pixels of the sub pixel columns disposed on the other side of the first power line, each of the second power lines is electrically connected to each of the second sub-pixels of the sub-pixel columns disposed on one side of the second power line, and each of the second power lines is electrically connected to each of the second sub-pixels of the sub-pixel columns disposed on the other side of the second power line.

According to another preferred embodiment of the present invention, a pixel structure of an electroluminescent display panel is further provided. The pixel structure includes a plurality of sub-pixel columns, a plurality of first power lines and a plurality of second power lines. Each of the sub-pixel columns includes a plurality of sub-pixels. The sub-pixels of a same sub-pixel column have a same display color, and the sub-pixels of two adjacent sub-pixel columns have different display colors. Each of the first power lines and each of the second power lines are disposed between two adjacent sub-pixel columns, each of the first power lines is electrically connected to a portion of the sub-pixels of the sub-pixel columns disposed on one side of the first power line, each of the first power lines is electrically connected to a portion of the sub-pixels of the sub-pixel columns disposed on the other side of the first power line, each of the second power lines is electrically connected to a portion of the sub-pixels of the sub-pixel columns disposed on one side of the second power line, and each of the second power lines is electrically connected to a portion of the sub-pixels of the sub-pixel columns disposed on the other side of the second power line.

The pixel structure of the electroluminescent display panel in accordance to the present invention utilizes a plurality of first power lines and a plurality of second power lines to provide a first voltage signal and a second voltage signal respectively, and each of the power lines is electrically connected to a portion of the sub-pixels on two opposite sides of the power lines alternately, avoiding voltage signal drops due to the electrical resistance of the power lines and avoiding uneven display images of the electroluminescent display panel effectively.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, preferred embodiments will be detailed as follows. The preferred embodiments of the present invention are illustrated in the accompanying drawings with numbered elements to elaborate the contents and effects to be achieved.

Figure 1:
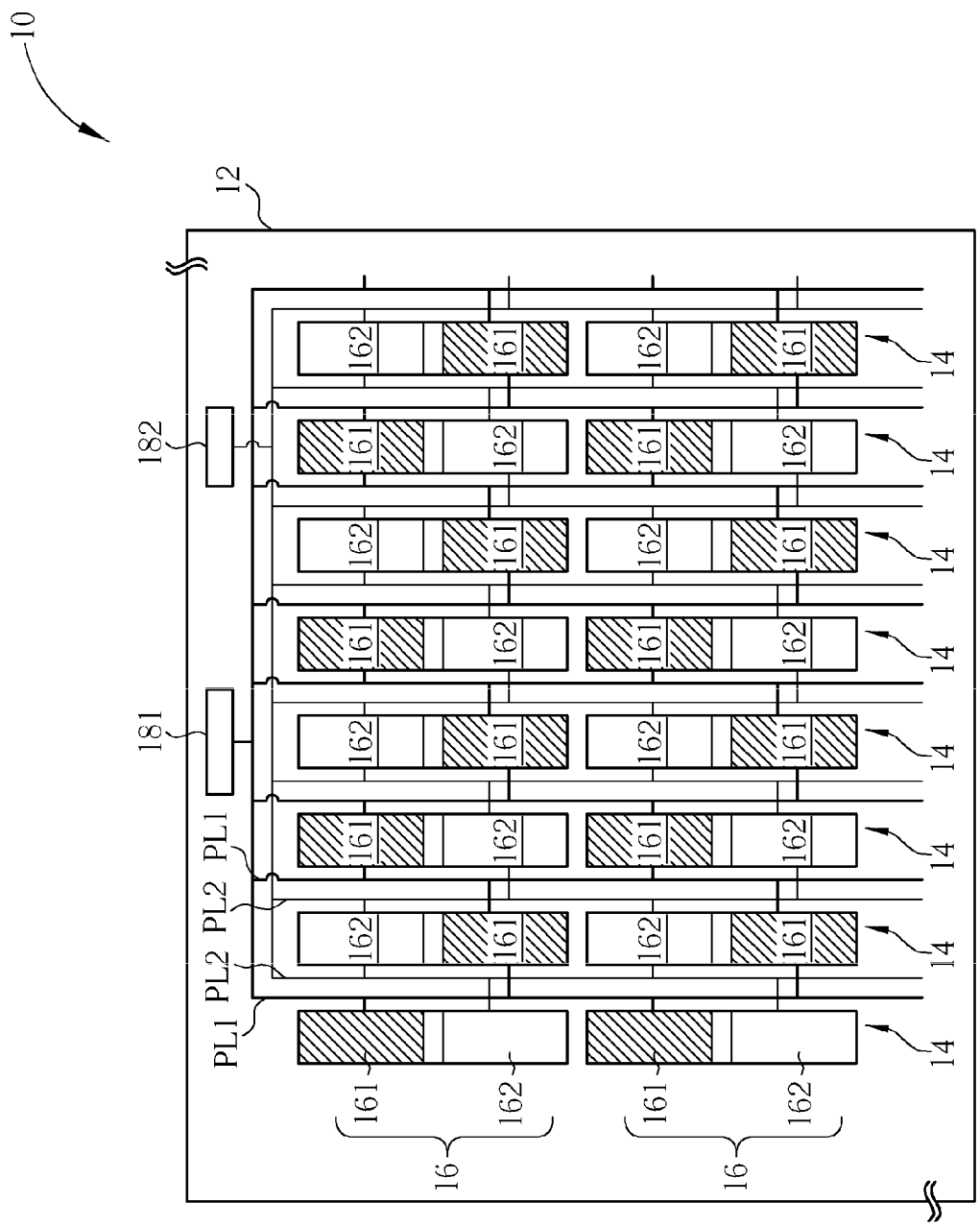
FIG. 1 is a schematic diagram illustrating a pixel structure of an electroluminescent display panel in accordance to a first embodiment of the present invention.

Referring to FIG. 1, FIG. 1 is a schematic diagram illustrating a pixel structure of an electroluminescent display panel in accordance to a first embodiment of the present invention. As illustrated in FIG. 1, the pixel structure 10 of the electroluminescent display panel in accordance to the present embodiment is disposed on a substrate 12, and the pixel structure 10 includes a plurality of sub-pixel columns 14, a plurality of first power lines PL1 and a plurality of second power lines PL2. The sub-pixel columns 14 in accordance to the present embodiment is a collection of sub-pixels aligned along a column direction (a perpendicular direction) of FIG. 1. Each of the sub-pixel columns 14 includes a plurality of sub-pixels 16, and each of the sub-pixels 16 at least includes a first sub-pixel 161 and a second sub-pixel 162. The first sub-pixel 161 and the second sub-pixel 162 are used to display the same sub-pixel frame, but the first sub-pixel 161 and the second sub-pixel 162 are electrically insulated from each other, and the first sub-pixel 161 and the second sub-pixel 162 receive different voltage signals respectively. Furthermore, each of the first power lines PL1 and each of the second power lines PL2 are disposed between two adjacent sub-pixel columns 14. Each of the first power lines PL1 is electrically connected to the first sub-pixel 161 of each of the sub-pixels 16 of the sub-pixel columns 14 disposed on one side of the first power line PL1, and each of the first power lines PL1 is electrically connected to the first sub-pixel 161 of each of the sub-pixels 16 of the sub-pixel columns 14 disposed on the other side of the first power line PL1; each of the second power lines PL2 is electrically connected to the second sub-pixel 162 of each of the sub-pixels 16 of the sub-pixel columns 14 disposed on one side of the second power line PL2, and each of the second power lines PL2 is electrically connected to the second sub-pixel 162 of each of the sub-pixels 16 of the sub-pixel columns 14 disposed on the other side of the second power line PL2. Moreover, the first power lines PL1 receive at least a first voltage signal provided by a first driving chip (first voltage source) 181, and the second power lines PL2 receive at least a second voltage signal provided by a second driving chip (second voltage source) 182, where the first voltage signal is preferably different from the second voltage signal. The first driving chip 181 in accordance to the present embodiment is electrically connected to one end of each of the first power lines PL1, and thus the first driving chip 181 can provide the first voltage signal through the end of each of the first power lines PL1. In addition, the second driving chip 182 in accordance to the present embodiment is electrically connected to one end of each of the second power lines PL2, and thus the second driving chip 182 can provide the second voltage signal through the end of each of the second power lines PL2. In other words, the one end of each of the first power lines PL1 electrically connected to the first driving chip 181 is a VDD end, and the other end of each of the first power lines PL1 is a VSS end; likewise, the one end of each of the second power lines PL2 electrically connected to the second driving chip 182 is a VDD end, and the other end of each of the second power lines PL2 is a VSS end. However, the relationship between the first voltage signal and the second voltage signal, the amount of the first driving chip 181 and the second driving chip 182, the connection method between the first driving chip 181 and the first power lines PL1 and the connection method between the second driving chip 182 and the second power lines PL2 are not limited. For example, the first voltage signal and the second voltage signal may be a same voltage signal, or the first driving chip 181 may provide the first voltage signal through one end of each of the first power lines PL1 and the second driving chip 182 may provide the second voltage signal through one end of each of the second power lines PL2 from the opposite side of the first driving chip 181 on the substrate 12, or the first driving chip 181 may also provide the first voltage signal through two ends of each of the first power lines PL1 and the second driving chip 182 may also provide the second voltage signal through two ends of each of the second power lines PL2.

According to the present embodiment, each of the sub-pixels 16 of the sub-pixel column 14 of the $(2n-1)^{th}$ column is arranged in an order of a first sub-pixel 161 and a second sub-pixel 162 sequentially in turn, and each of the sub-pixels 16 of the sub-pixel column 14 of the $2n^{th}$ column is arranged in an order of a second sub-pixel 162 and a first sub-pixel 161 sequentially in turn, where n is an integer greater than or equal to 1. For example, the sub-pixels 16 of the sub-pixel column 14 of the $1^{st}$ column have an arrangement from top to bottom as follows: a first sub-pixel 161, a second sub-pixel 162, a first sub-pixel 161 and so forth. In addition, the sub-pixels 16 of the sub-pixel column 14 of the $2^{nd}$ column have an arrangement from top to bottom as follows: a second sub-pixel 162, a first sub-pixel 161, a second sub-pixel 162 and so forth. Furthermore, the nth first power line PL1 is disposed between the sub-pixel column 14 of the nth column and the sub-pixel column 14 of the $(n+1)^{th}$ column, and the $n^{th}$ second power line PL2 is disposed between the sub-pixel column 14 of the $n^{th}$ column and the sub-pixel column 14 of the $(n+1)^{th}$ column. For example, the $1^{st}$ first power line PL1 is disposed between the sub-pixel column 14 of the $1^{st}$ column and the sub-pixel column 14 of the $2^{nd}$ column, and the $2^{nd}$ first power line PL1 is disposed between the sub-pixel column 14 of the $2^{nd}$ column and the sub-pixel column 14 of the $3^{rd}$ column and so forth. In addition, the $1^{st}$ second power line PL2 is disposed between the sub-pixel column 14 of the $1^{st}$ column and the sub-pixel column 14 of the $2^{nd}$ column, and the $2^{nd}$ second power line PL2 is disposed between the sub-pixel column 14 of the $2^{nd}$ column and the sub-pixel column 14 of the $3^{rd}$ column, and so forth. Furthermore, the sub-pixels 16 of the same sub-pixel column 14 in accordance to the present embodiment have a same display color, and the sub-pixels 16 of two adjacent sub-pixel columns 14 have different display colors, but are not limited. For example, the sub-pixels 16 on the sub-pixel column 14 of the $(3n-2)^{th}$ column include the first sub-pixel 161 and the second sub-pixel 162, and the first sub-pixel 161 and the second sub-pixel 162 have the same display color, e.g. red color; the sub-pixels 16 of the sub-pixel column 14 of the $(3n-1)^{th}$ column include the first sub-pixel 161 and the second sub-pixel 162, and the first sub-pixel 161 and the second sub-pixel 162 have the same display color, e.g. green color; the sub-pixels 16 on the sub-pixel column 14 of the $3n^{th}$ column include the first sub-pixel 161 and the second sub-pixel 162, and the first sub-pixel 161 and the second sub-pixel 162 have the same display color, e.g. blue color, where n is an integer greater than or equal to 1. Thus, the sub-pixels 16 of a same sub-pixel column 14 have a same display color, but the sub-pixels 16 of two adjacent sub-pixel columns 14 would have different display colors.

Figure 2:
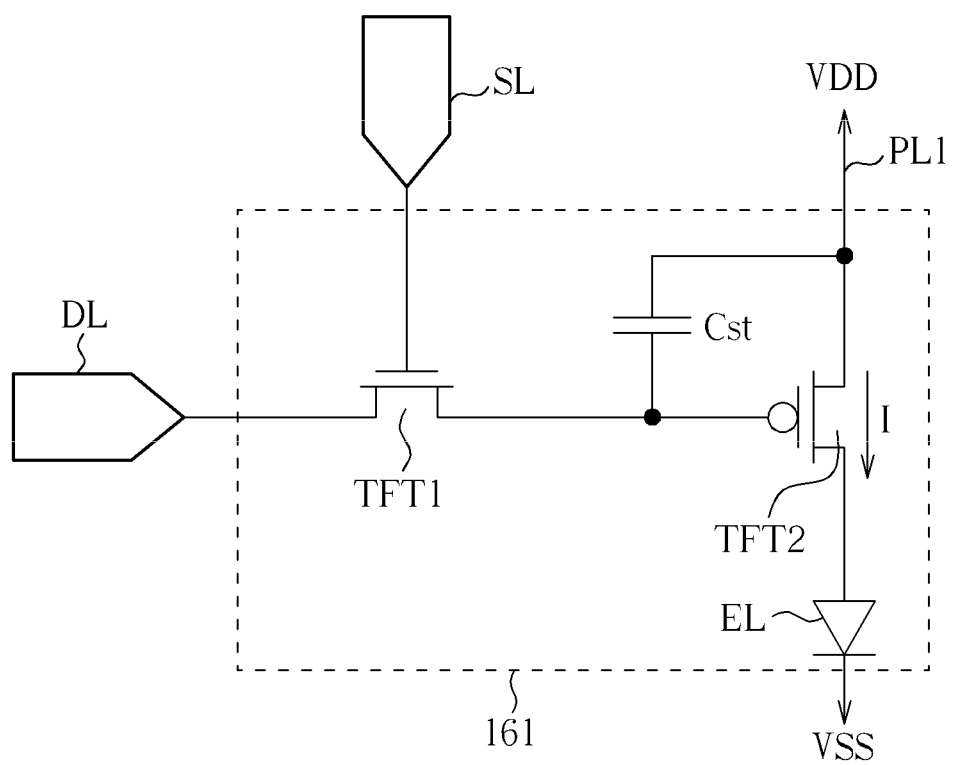
FIG. 2 is a schematic diagram illustrating a single sub-pixel of the pixel structure in FIG. 1.

Referring to FIG. 2 and FIG. 1 together, FIG. 2 is a schematic diagram illustrating a single sub-pixel (e.g. a single first sub-pixel or a single second sub-pixel) of the pixel structure in FIG. 1. As illustrated in FIG. 2, using the first sub-pixel 161 as an example, the first sub-pixel 161 includes a first switching device TFT1, a second switching device TFT2, a storage capacitor Cst and an electroluminescent device EL. The first switching device TFT1 and the second switching device TFT2, for example, may be a thin film transistor device, and the electroluminescent device EL, for example, may be an organic light-emitting diode device, but are not limited. A gate electrode of the first switching device TFT1 is electrically connected to a scan line SL, a source electrode of the first switching device TFT1 is electrically connected to a data line DL, and a drain electrode of the first switching device TFT1 is electrically connected to a gate electrode of the second switching device TFT2 and an electrode of the storage capacitor Cst. A source electrode of the second switching device TFT2 is electrically connected to the first power line PL1 and the other electrode of the storage capacitor Cst. The drain electrode of the second switching device TFT2 is electrically connected to the electroluminescent device EL. During image displays, signals deliver by the scan line SL turn on the first switching device TFT1 while signals delivered by the data line DL pass the first switching device TFT1 and turn on the second switching device TFT2. The storage capacitor Cst maintains the opening time frame of the second switching device TFT2 so that the first voltage signal provided by the first power lines PL1 may pass through the second switching device TFT2 and drive the electroluminescent device EL to luminance.

The pixel structure 10 of the electroluminescent display panel in accordance to the present embodiment includes a plurality of first power lines PL1 and a plurality of second power lines PL2. Each of the first power lines PL1 is electrically connected to the first sub-pixel 161 on two opposite sides of the first power lines PL1 alternately, and each of the second power lines PL2 is electrically connected to the second sub-pixel 162 on opposite two sides of the second power lines PL2 alternately. The connection method described above compensates the issue of voltage drop which occurs when only a single power line is employed to drive all the sub-pixels of a column. With the issue of voltage drop compensated, the display images would be more even, improving the quality of display.

The embodiments of the pixel structure of the electroluminescent display panel in accordance to the present invention are not limited to the embodiments described above. The passages below will discuss other embodiments of the pixel structure of the electroluminescent display panel in accordance to the present invention. To simplify the description and for the convenience of comparison between each of the embodiments of the present invention, identical elements are denoted by identical numerals. Also, only the differences are illustrated, and repeated descriptions are not redundantly given.

Figure 3:
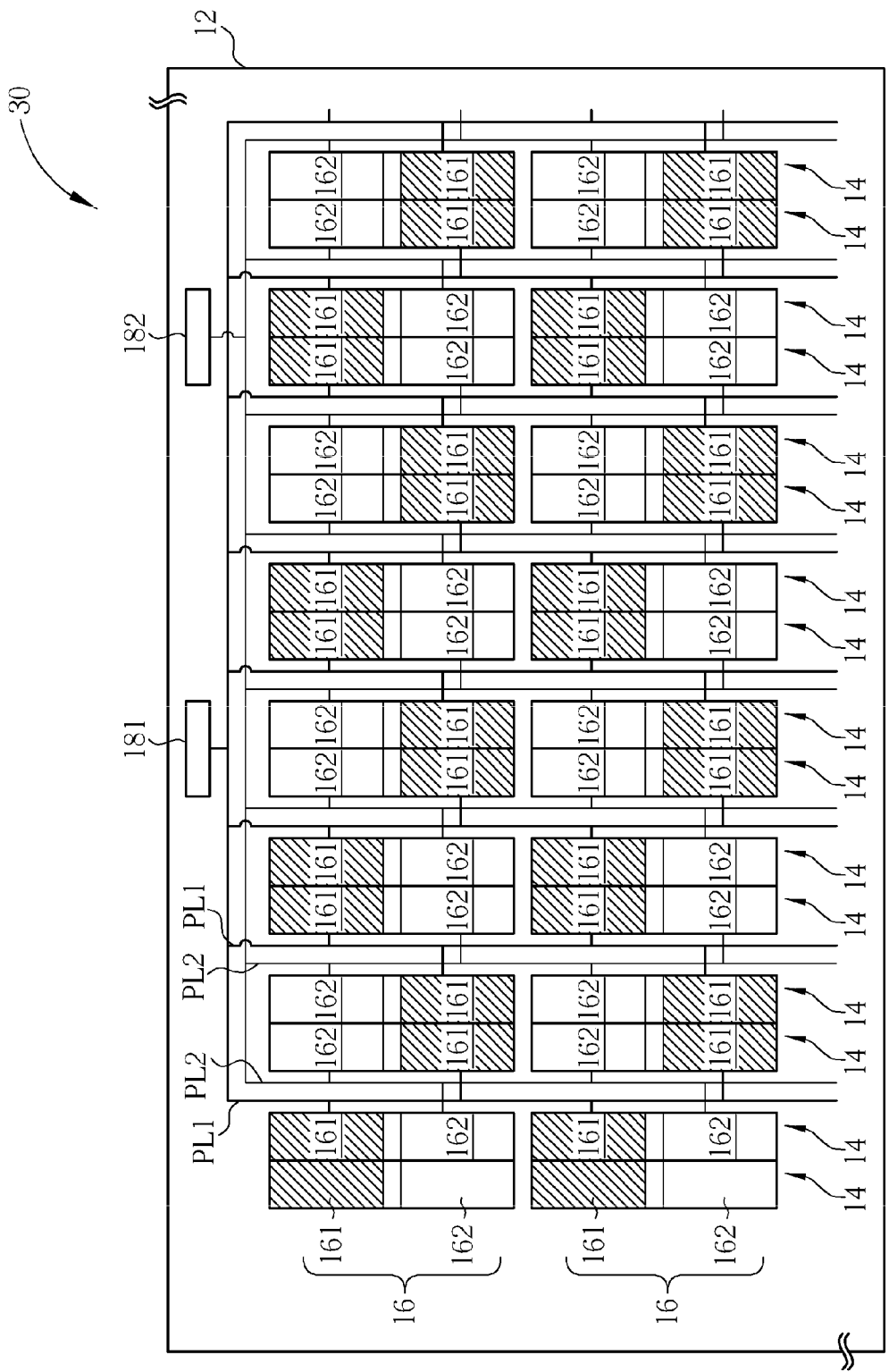
FIG. 3 is a schematic diagram illustrating a pixel structure of an electroluminescent display panel in accordance to a second preferred embodiment of the present invention.

Referring to FIG. 3, FIG. 3 is a schematic diagram illustrating a pixel structure of an electroluminescent display panel in accordance to a second preferred embodiment of the present invention. As illustrated in FIG. 3, in a pixel structure 30 of an electroluminescent display panel in accordance to the present embodiment, an arrangement of the first sub-pixel 161 and the second sub-pixel 162 of the sub-pixels 16 is different from that of the first embodiment. To be exact, each of the sub-pixels 16 of the sub-pixel column 14 of the $(4n-3)^{th}$ column and each of the sub-pixels 16 of the sub-pixel column 14 of the $(4n-2)^{th}$ column are arranged in an order of a first sub-pixel 161 and a second sub-pixel 162 sequentially in turn, and each of the sub-pixels 16 of the sub-pixel column 14 of the $(4n-1)^{th}$ column and each of the sub-pixels 16 of the sub-pixel column 14 of the $(4n)^{th}$ column are arranged in an order of a second sub-pixel 162 and first sub-pixel 161 sequentially in turn, where n is an integer greater than or equal to 1. For example, the sub-pixels 16 of the sub-pixel column 14 of the $1^{st}$ column and the sub-pixels 16 of the sub-pixel column 14 of the $2^{nd}$ column have an arrangement from top to bottom as follows: a first sub-pixel 161, a second sub-pixel 162, a first sub-pixel 161 and so forth; the sub-pixels 16 of the sub-pixel column 14 of the $3^{rd}$ column and the sub-pixels 16 of the sub-pixel column 14 of the $4^{th}$ column have an arrangement from top to bottom as follows: a second sub-pixel 162, a first sub-pixel 161, a second sub-pixel 162 and so forth. In addition, positions of the first power lines PL1 and the second power lines PL2 are also different from that of the first preferred embodiment. To be exact, the $n^{th}$ first power line PL1 is disposed between the sub-pixel column 14 of the $2n^{th}$ column and the sub-pixel column 14 of the $(2n+1)^{th}$ column, and the $n^{th}$ second power line PL2 is disposed between the sub-pixel column 14 of the $2n^{th}$ column and the sub-pixel column 14 of the $(2n+1)^{th}$ column. For example, the $1^{st}$ first power line PL1 and the $1^{st}$ second power line PL2 are disposed between the sub-pixel column 14 of the $2^{nd}$ column and the sub-pixel column 14 of the $3^{rd}$ column, and the $2^{nd}$ first power line PL1 and the $2^{nd}$ second power line PL2 are disposed between the sub-pixel column 14 of the $4^{th}$ column and the sub-pixel column 14 of the $5^{th}$ column, and so forth.

Figure 4:
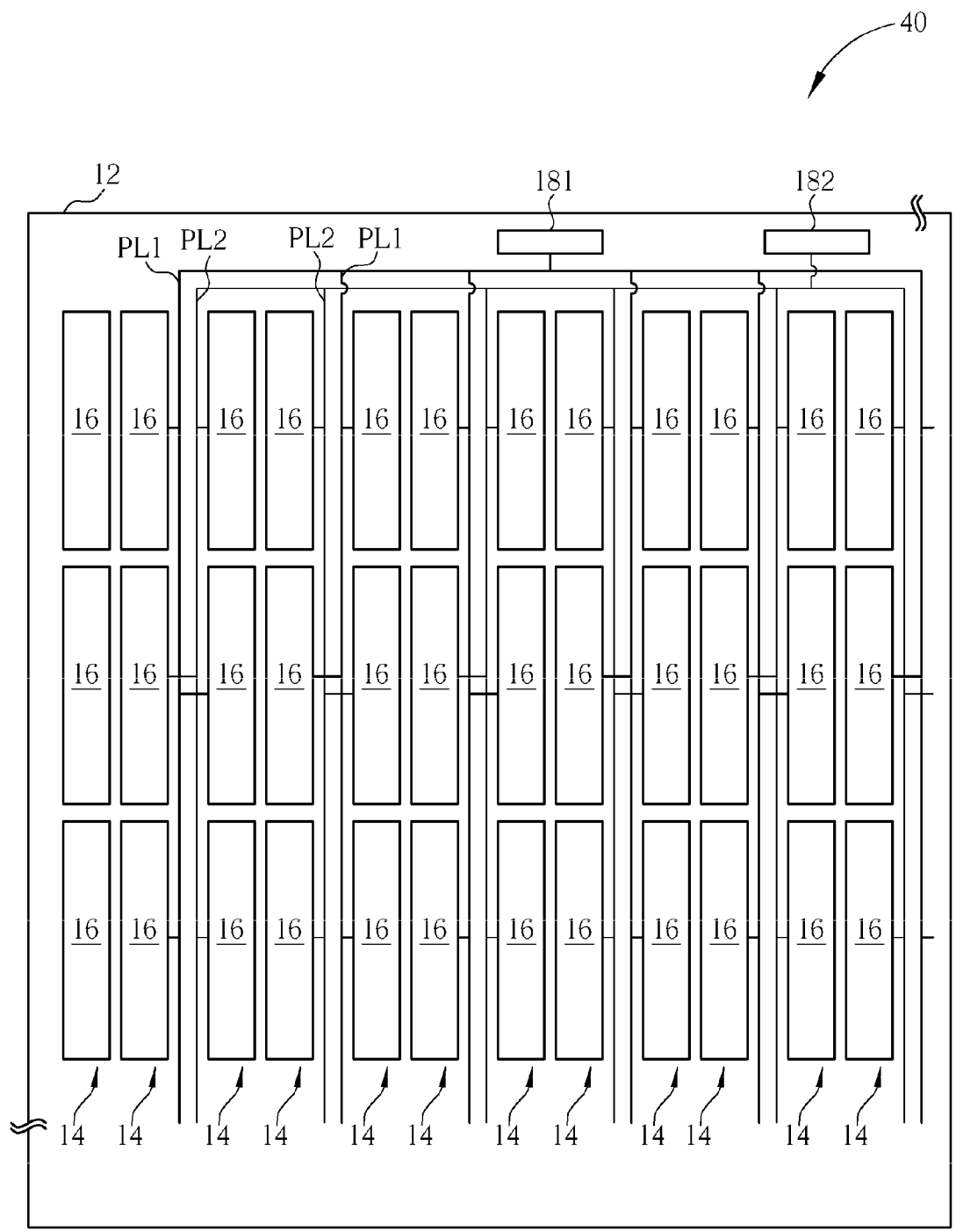
FIG. 4 is a schematic diagram illustrating a pixel structure of an electroluminescent display panel in accordance to a third embodiment of the present invention.

Referring to FIG. 4, FIG. 4 is a schematic diagram illustrating a pixel structure of an electroluminescent display panel in accordance to a third embodiment of the present invention. As illustrated in FIG. 4, in a pixel structure 40 of an electroluminescent display panel in accordance to the present embodiment, the sub-pixels 16 of a same sub-pixel column 14 have a same display color, but the sub-pixels 16 of two adjacent sub-pixel columns 14 have different display colors. Different from the first preferred embodiment, each of the sub-pixels 16 in accordance to the present embodiment does not further include a first sub-pixel and a second sub-pixel. Furthermore, the $n^{th}$ first power line PL1 is disposed between the sub-pixel column 14 of the $2n^{th}$ column and the sub-pixel column 14 of the $(2n+1)^{th}$ column, and the $n^{th}$ second power line PL2 is disposed between the sub-pixel column 14 of the $2n^{th}$ column and the sub-pixel column 14 of the $(2n+1)^{th}$ column, where n is an integer grater than or equal to 1. For example, the $1^{st}$ first power line PL1 and the $1^{st}$ second power line PL2 are disposed between the sub-pixel column 14 of the $2^{nd}$ column and the sub-pixel column 14 of the $3^{rd}$ column, and the $2^{nd}$ first power line PL1 and the $2^{nd}$ second power line PL2 are disposed between the sub-pixel column 14 of the $4^{th}$ column and the sub-pixel column 14 of the $5^{th}$ column, and so forth. Furthermore, each of the first power lines PL1 is electrically connected to a portion of the sub-pixels 16 of the sub-pixel columns 14 disposed on one side of the first power line PL1, each of the first power lines PL1 is electrically connected to a portion of the sub-pixels 16 of the sub-pixel columns 14 disposed on the other side of the first power line PL1, each of the second power lines PL2 is electrically connected to a portion of the sub-pixels 16 of the sub-pixel columns 14 disposed on one side of the second power line PL2, and each of the second power lines PL2 is electrically connected to a portion of the sub-pixels 16 of the sub-pixel columns 14 disposed on the other side of the second power line PL2. To be exact, the $n^{th}$ first power line PL1 is electrically connected to the sub-pixel 16 of the $(2m-1)^{th}$ row of the sub-pixel column 14 of the $2n^{th}$ column, the $n^{th}$ first power line PL1 is electrically connected to the sub-pixel 16 of the $2m^{th}$ row of the sub-pixel column 14 of the $(2n+1)^{th}$ column, the $n^{th}$ second power line PL2 is electrically connected to the sub-pixel of the $2m^{th}$ row of the sub-pixel column 14 of the $2n^{th}$ column, and the $n^{th}$ second power line PL2 is electrically connected to the sub-pixel 16 of the $(2m-1)^{th}$ row of the sub-pixel column 14 of the $(2n+1)^{th}$ column, where m is an integer greater than or equal to 1. For example, the $1^{st}$ first power line PL1 is electrically connected to the sub-pixels 16 of the odd number rows of the sub-pixel column 14 of the $2^{nd}$ column, the $1^{st}$ first power line PL1 is electrically connected the sub-pixels 16 of the even number rows of the sub-pixel column 14 of the $3^{rd}$ column, the $1^{st}$ second power line PL2 is electrically connected to the sub-pixels 16 of the even number rows of the sub-pixel column 14 of the $2^{nd}$ column, and the $1^{st}$ second power line PL2 is electrically connected to the sub-pixels 16 of the odd number rows of the sub-pixel column 14 of the $3^{rd}$ column, and so forth.

In summary, the pixel structure of the electroluminescent display panel in accordance to the present invention utilizes a plurality of first power lines and a plurality of second power lines to provide the first voltage signal and the second voltage signal respectively, and each of the power lines is electrically connected to a portion of the sub-pixels on opposite sides of the power lines alternately, avoiding voltage signal drops caused by the electrical resistance of the power lines and avoiding uneven display images of the electroluminescent display panel effectively. In addition, through adjusting the connection method between the first driving chip and the first power lines, the connection method between the second driving chip and the second power lines or adjusting the relationship between the first voltage signal and the second voltage signal, the voltage drop induced by the electrical resistance of the power lines is further compensated, improving the quality of display significantly.

Those skilled in the art will readily observe that numerous modifications and alterations of the device and method may be made while retaining the teachings of the invention.

What is claimed is:

1. A pixel structure of an electroluminescent display panel, comprising:
   a plurality of sub-pixel columns, wherein each of the sub-pixel columns comprises a plurality of sub-pixel units, each of the sub-pixel units comprises a first sub-pixel and a second sub-pixel, and the first sub-pixel and the second sub-pixel of said each of the sub-pixel units are electrically insulated from each other; and
   a plurality of first power lines and a plurality of second power lines, wherein each of the first power lines and each of the second power lines are disposed between two adjacent sub-pixel columns, said each of the first power lines is electrically connected to the first sub-pixel of said each of the sub-pixel units of the sub-pixel column disposed on one side of said each of the first power lines, said each of the first power lines is electrically connected to the first sub-pixel of said each of the sub-pixel units of the sub-pixel column disposed on the other side of said each of the first power lines, the first power lines are electrically disconnected from the second sub-pixels, said each of the second power lines is electrically connected to the second sub-pixel of said each of the sub-pixel units of the sub-pixel column disposed on one side of said each of the second power lines, said each of the second power lines is electrically connected to the second sub-pixel of said each of the sub-pixel units of the sub-pixel column disposed on the other side of said each of the second power lines, and the second power lines are electrically disconnected from the first sub-pixels.

2. The pixel structure of the electroluminescent display panel of claim 1, wherein said each of the sub-pixel units in a $(2n-1)^{th}$ column of the sub-pixel columns is arranged in an order of the first sub-pixel and the second sub-pixel sequentially in turn, and said each of the sub-pixel units in a $2n^{th}$ column of the sub-pixel columns is arranged in an order of the second sub-pixel and the first sub-pixel sequentially in turn, where n is a positive integer greater than or equal to 1.

3. The pixel structure of the electroluminescent display panel of claim 2, wherein an $n^{th}$ first power line is disposed between an $n^{th}$ column of the sub-pixel columns and an $(n+1)^{th}$ column of the sub-pixel columns, and an $n^{th}$ second power line is disposed between the $n^{th}$ column of the sub-pixel columns and the $(n+1)^{th}$ column of the sub-pixel columns.

4. The pixel structure of the electroluminescent display panel of claim 1, wherein the sub-pixel units of a same sub-pixel column have a same display color, and the sub-pixel units of said two adjacent sub-pixel columns have different display colors.

5. The pixel structure of the electroluminescent display panel of claim 1, wherein the first power lines and the second power lines comprise a first voltage signal and a second voltage signal respectively, and the first voltage signal is different from the second voltage signal.

6. A pixel structure of an electroluminescent display panel, comprising:
   a plurality of sub-pixel columns, wherein each of the sub-pixel columns comprises a plurality of sub-pixel units, the sub-pixel units of a same sub-pixel column have a same display color, and the sub-pixel units of two adjacent sub-pixel columns have different display colors; and
   a plurality of first power lines and a plurality of second power lines, wherein each of the first power lines and each of the second power lines are disposed between said two adjacent sub-pixel columns, said each of the first power lines is electrically connected to a first portion of the sub-pixel units of the sub-pixel column disposed on one side of said each of the first power lines, said each of the first power lines is electrically connected to a first portion of the sub-pixel units of the sub-pixel column disposed on the other side of said each of the first power lines, said each of the first power lines is electrically disconnected from a second portion of the sub-pixel units of the sub-pixel column disposed on said one side of said each of the first power lines, said each of the first power lines is electrically disconnected from a second portion of the sub-pixel units of the sub-pixel column disposed on the other side of said each of the first power lines, said each of the second power lines is electrically connected to the second portion of the sub-pixel units of the sub-pixel column disposed on one side of said each of the second power lines, said each of the second power lines is electrically connected to the second portion of the sub-pixel units of the sub-pixel column disposed on the other side of said each of the second power lines, said each of the second power lines is electrically disconnected from the first portion of the sub-pixel units of the sub-pixel column disposed on said one side of said each of the first power lines, and said each of the second power lines is electrically disconnected from the first portion of the sub-pixel units of the sub-pixel column disposed on the other side of said each of the first power lines.

7. The pixel structure of the electroluminescent display panel of claim 6, wherein said each of the sub-pixel units comprises a first sub-pixel and a second sub-pixel, and the first sub-pixel and the second sub-pixel of said each of the sub-pixel units are electrically insulated from each other.

8. The pixel structure of the electroluminescent display panel of claim 7, wherein said each of the sub-pixel units in a $(2n-1)^{th}$ column of the sub-pixel columns is arranged in an order of the first sub-pixel and the second sub-pixel sequentially in turn, and said each of the sub-pixel units in a $2n^{th}$ column of the sub-pixel columns is arranged in an order of the second sub-pixel and the first sub-pixel sequentially in turn, where n is a positive integer greater than or equal to 1.

9. The pixel structure of the electroluminescent display panel of claim 8, wherein an $n^{th}$ first power line is disposed between an $n^{th}$ column of the sub-pixel columns and an $(n+1)^{th}$ column of the sub-pixel columns, and an $n^{th}$ second power line is disposed between the $n^{th}$ column of the sub-pixel columns and $(n+1)^{th}$ column of the sub-pixel columns.

* * * * *